(12) United States Patent
Cui et al.

(10) Patent No.: US 6,442,728 B1
(45) Date of Patent: Aug. 27, 2002

(54) METHODS AND APPARATUS FOR TURBO CODE

(75) Inventors: Jian Cui, Nepean; Bin Li, Ottawa; Weng Tong, Ottawa; Rui R. Wang, Ottawa, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/263,431

(22) Filed: Mar. 4, 1999

Related U.S. Application Data

(60) Provisional application No. 60/115,394, filed on Jan. 11, 1999.

(51) Int. Cl.$^7$ .............................................. H03M 13/00
(52) U.S. Cl. ........................ 714/786; 714/755; 714/790
(58) Field of Search ................................ 714/786, 790, 714/756, 755

(56) References Cited

U.S. PATENT DOCUMENTS

| 4,394,642 A | 7/1983 | Currie |
| 5,742,612 A | 4/1998 | Gourge |

OTHER PUBLICATIONS

"Computer Dictionary" Microsoft Press, Second Edition, 1994, pp. 218–219.*

Interleaver design for turbo codes with reduced memory requirement, ETSI SMG2 UMTS L1 Expert Group, Tdoc SMG2 UMTS L1 510–98, Nov. 1998.

Description of the GF Interleaver for Turbo Codes, ETSI SMG2 UMTS L1 Expert Group, Tdoc SMG2 UMTS–L1 765/98, Jan. 1999.

Algebraic interleavers for turbo codes: Precisions on complexity and interleaver generation, ETSI SMG2 UMTS L1 Expert Group, Tdoc SMG2 UMTS–L1 721–98, Dec. 1998.

A Proposal for Turbo Code Interleaving, mschaff1@email.mot.com, Motorola, Inc. 1998.

Turbo Interleaver Performance Evaluation, brownta@cig.mot.com, Motorola, Inc., 1998.

A new Low–Complexity TurboCode Interleaver Employing Linear Congruential Sequences (Revised), fling@qualcomm.com, Qualcomm, Inc., 1998.

New Interleaver Proposals from Lucent Technologies.

* cited by examiner

*Primary Examiner*—Phung M. Chung
(74) *Attorney, Agent, or Firm*—Cobrin & Gittes

(57) ABSTRACT

An interleaver receives incoming data frames of size N. The interleaver indexes the elements of the frame with an $N_1 \times N_2$ index array. The interleaver then effectively rearranges (permutes) the data by permuting the rows of the index array. The interleaver employs the equation $I(j,k)=I(j,\alpha_j k+\beta_j)\bmod P)$ to permute the columns (indexed by k) of each row (indexed by j). P is at least equal to $N_2$, $\beta_j$ is a constant which may be different for each row, and each $\alpha_j$ is a relative prime number relative to P. After permuting, the interleaver outputs the data in a different order than received (e.g., receives sequentially row by row, outputs sequentially each column by column).

35 Claims, 5 Drawing Sheets

```
Matrix D 350:

0    1    2    3    4    5  ←──── col. k
    0  │FE00 FE01 FE02 FE03 FE04 FE05│
    1  │FE06 FE07 FE08 FE09 FE10 FE11│
    2  │FE12 FE13 FE14 FE15 FE16 FE17│
    ↑
    row j
              Permutation according to
              D₁(j,k) = D(j, (α_j*k + β_j)modP )
                where  α = 5, 5, 5
                       β = 1, 2, 3
                       P = 6

Matrix D₁ 360:

0    1    2    3    4    5  ←──── col. k
    0  │FE01 FE00 FE05 FE04 FE03 FE02│
    1  │FE08 FE07 FE06 FE11 FE10 FE09│
    2  │FE15 FE14 FE13 FE12 FE17 FE16│
    ↑
    row j
```

Conventional Turbo Coder

Matrix D 350:

|       | 0    | 1    | 2    | 3    | 4    | 5    |  ← col. k
|-------|------|------|------|------|------|------|
| 0     | FE00 | FE01 | FE02 | FE03 | FE04 | FE05 |
| 1     | FE06 | FE07 | FE08 | FE09 | FE10 | FE11 |
| 2     | FE12 | FE13 | FE14 | FE15 | FE16 | FE17 |

↑
row j

Permutation according to
$D_1(j,k) = D(j, (\alpha_j * k + \beta_j) \bmod P)$
where $\alpha = 5, 5, 5$
$\beta = 1, 2, 3$
$P = 6$ Matrix $D_1$ 360:

|       | 0    | 1    | 2    | 3    | 4    | 5    |  ← col. k
|-------|------|------|------|------|------|------|
| 0     | FE01 | FE00 | FE05 | FE04 | FE03 | FE02 |
| 1     | FE08 | FE07 | FE06 | FE11 | FE10 | FE09 |
| 2     | FE15 | FE14 | FE13 | FE12 | FE17 | FE16 |

↑
row j

FIG. 3

Index Matrix I 550: (Indexes Data Frame 110 (FIG. 4))

|   | 0 | 1 | 2 | 3 | 4 | 5 | 6 | 7 | ← col. k |
|---|---|---|---|---|---|---|---|---|---|
| 0 | 00 | 01 | 02 | 03 | 04 | 05 | 06 | 07 | |
| 1 | 08 | 09 | 10 | 11 | 12 | 13 | 14 | 15 | |
| 2 | 16 | 17 | 18 | 19 | 20 | 21 | 22 | 23 | |
| 3 | 24 | 25 | 26 | 27 | 28 | 29 | 30 | 31 | |

↑
row j

Permutation according to
$I_1(j,k) = I(j, (\alpha_j * k + \beta_j) \bmod P)$
where $\alpha = 1, 3, 5, 7$
$\beta = 0, 0, 0, 0$
$P = 8$ Index Matrix $I_1$ 560:

|   | 0 | 1 | 2 | 3 | 4 | 5 | 6 | 7 | ← col. k |
|---|---|---|---|---|---|---|---|---|---|
| 0 | 00 | 01 | 02 | 03 | 04 | 05 | 06 | 07 | |
| 1 | 08 | 11 | 14 | 09 | 12 | 15 | 10 | 13 | |
| 2 | 16 | 21 | 18 | 23 | 20 | 17 | 22 | 19 | |
| 3 | 24 | 31 | 30 | 29 | 28 | 27 | 26 | 25 | |

↑
row j

FIG. 5

METHODS AND APPARATUS FOR TURBO CODE

CROSS-REFERENCE TO RELATED APPLICATIONS

This application claims the benefit of U.S. Provisional Application No. 60/115,394 filed Jan. 11, 1999.

FIELD OF THE INVENTION

This invention relates generally to communication systems and, more particularly, to interleavers for performing code modulation.

BACKGROUND OF THE INVENTION

Techniques for encoding communication channels, known as coded modulation, have been found to improve the bit error rate (BER) of electronic communication systems such as modem and wireless communication systems. Turbo coded modulation has proven to be a practical, power-efficient, and bandwidth-efficient modulation method for "random-error" channels characterized by additive white Gaussian noise (AWGN) or fading. These random-error channels can be found, for example, in the code division multiple access (CDMA) environment. Since the capacity of a CDMA environment is dependent upon the operating signal to noise ratio, improved performance translates into higher capacity.

An aspect of turbo coders which makes them so effective is an interleaver which permutes the original received or transmitted data frame before it is input to a second encoder. The permuting is accomplished by randomizing portions of the signal based upon one or more randomizing algorithms. Combining the permuted data frames with the original data frames has been shown to achieve low BERs in AWGN and fading channels. The interleaving process increases the diversity in the data such that if the modulated symbol is distorted in transmission the error may be recoverable with the use of error correcting algorithms in the decoder.

A conventional interleaver collects, or frames, the signal points to be transmitted into an array, where the array is sequentially filled up row by row. After a predefined number of signal points have been framed, the interleaver is emptied by sequentially reading out the columns of the array for transmission. As a result, signal points in the same row of the array that were near each other in the original signal point flow are separated by a number of signal points equal to the number of rows in the array. Ideally, the number of columns and rows would be picked such that interdependent signal points, after transmission, would be separated by more than the expected length of an error burst for the channel.

Non-uniform interleaving achieves "maximum scattering" of data and "maximum disorder" of the output sequence. Thus the redundancy introduced by the two convolutional encoders is more equally spread in the output sequence of the turbo encoder. The minimum distance is increased to much higher values than for uniform interleaving. A persistent problem for non-uniform interleaving is how to practically implement the interleaving while achieving sufficient "non-uniformity," and minimizing delay compensations which limit the use for applications with real-time requirements.

Finding an effective interleaver is a current topic in the third generation CDMA standard activities. It has been determined and generally agreed that, as the frame size approaches infinity, the most effective interleaver is the random interleaver. However, for finite frame sizes, the decision as to the most effective interleaver is still open for discussion.

Accordingly there exists a need for systems and methods of interleaving codes that improve non-uniformity for finite frame sizes.

There also exists a need for such systems and methods of interleaving codes which are relatively simple to implement.

It is thus an object of the present invention to provide systems and methods of interleaving codes that improve non-uniformity for finite frame sizes.

It is also an object of the present invention to provide systems and methods of interleaving codes which are relatively simple to implement.

These and other objects of the invention will become apparent to those skilled in the art from the following description thereof.

SUMMARY OF THE INVENTION

The foregoing objects, and others, may be accomplished by the present invention, which interleaves a data frame, where the data frame has a predetermined size and is made up of portions. An embodiment of the invention includes an interleaver for interleaving these data frames. The interleaver includes an input memory configured to store a received data frame as an array organized into rows and columns, a processor connected to the input memory and configured to permute the received data frame in accordance with the equation $D(j,k)=D(j, (\alpha_j k+\beta_j) \bmod P)$, and a working memory in electrical communication with the processor and configured to store a permuted version of the data frame. The elements of the equation are as follows: D is the data frame, j and k are indexes to the rows and columns, respectively, in the data frame, $\alpha$ and $\beta$ are sets of constants selected according to the current row, and P and each $\alpha_j$ are relative prime numbers. ("Relative prime numbers" connotes a set of numbers that have no common divisor other than 1. Members of a set of relative prime numbers, considered by themselves, need not be prime numbers.)

Another embodiment of the invention includes a method of storing a data frame and indexing it by an $N_1 \times N_2$ index array I, where the product of $N_1$ and $N_2$ is at least equal to N. The elements of the index array indicate positions of the elements of the data frame. The data frame elements may be stored in any convenient manner and need not be organized as an array. The method further includes permuting the index array according to $I(j,k)=I(j,(\alpha_j k+\beta_j) \bmod P)$, wherein I is the index array, and as above j and k are indexes to the rows and columns, respectively, in the index array, $\alpha$ and $\beta$ are sets of constants selected according to the current row, and P and each $\alpha_j$ are relative prime numbers. The data frame, as indexed by the permuted index array I, is effectively permuted.

Still another embodiment of the invention includes an interleaver which includes a storage device for storing a data frame and for storing an $N_1 \times N_2$ index array I, where the product of $N_1$ and $N_2$ is at least equal to N. The elements of the index array indicate positions of the elements of the data frame. The data frame elements may be stored in any convenient manner and need not be organized as an array. The interleaver further includes a permuting device for permuting the index array according to $I(j,k)=I(j,(\alpha_j k+\beta_j) \bmod P)$, wherein I is the index array, and as above j and k are indexes to the rows and columns, respectively, in the index array, $\alpha$ and $\beta$ are sets of constants selected according to the current row, and P and each $\alpha_j$ are relative prime numbers.

The data frame, as indexed by the permuted index array I, is effectively permuted.

The invention will next be described in connection with certain illustrated embodiments and practices. However, it will be clear to those skilled in the art that various modifications, additions and subtractions can be made without departing from the spirit or scope of the claims.

BRIEF DESCRIPTION OF THE DRAWINGS

The invention will be more clearly understood by reference to the following detailed description of an exemplary embodiment in conjunction with the accompanying drawings, in which:

FIG. 3 depicts an array containing a data frame, and permutation of that array;

FIG. 5 depicts an index array for indexing the data frame shown in FIG. 4, and permutation of the index array.

DETAILED DESCRIPTION OF THE INVENTION

Figure 1:
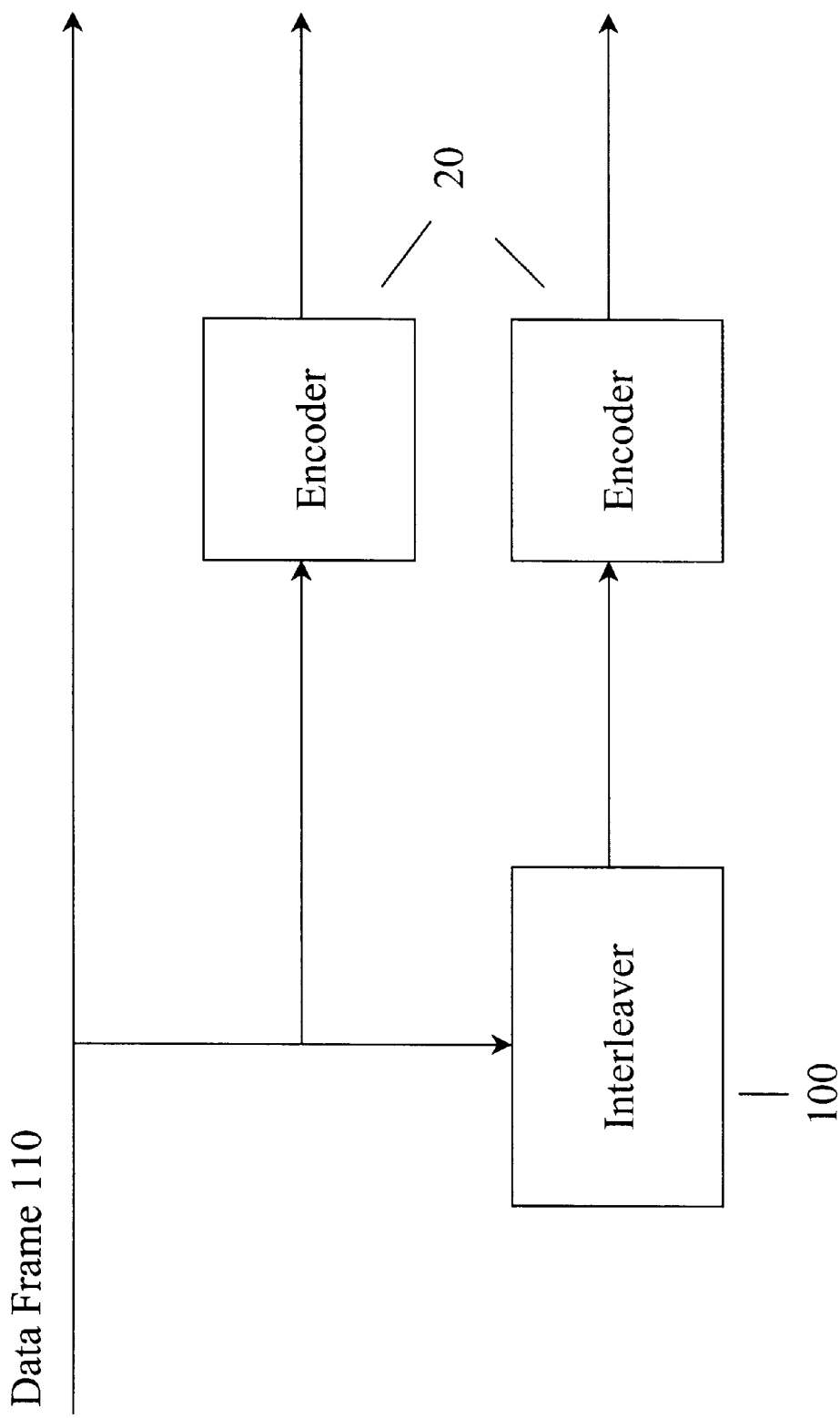
FIG. 1 depicts a diagram of a conventional turbo encoder.

FIG. 1 illustrates a conventional turbo encoder. As illustrated, conventional turbo encoders include two encoders 20 and an interleaver 100. An interleaver 100 in accordance with the present invention receives incoming data frames 110 of size N, where N is the number of bits, number of bytes, or the number of some other portion the frame may be separated into, which are regarded as frame elements. The interleaver 100 separates the N frame elements to sets of data, such as rows. The interleaver then rearranges (permutes) the data in each set (row) in a pseudo-random fashion. The interleaver 100 may employ different methods for rearranging the data of the different sets. However, those skilled in the art will recognize that one or more of the methods could be reused on one or more of the sets without departing from the scope of the invention. After permuting the data in each of the sets, the interleaver outputs the data in a different order than received.

The interleaver 100 may store the data frame 110 in an array of size $N_1 \times N_2$ such that $N_1 * N_2 = N$. An example depicted in FIG. 3 shows an array 350 having 3 rows ($N_1=3$) of 6 columns ($N_2=6$) for storing a data frame 110 having 18 elements, denoted Frame Element 00 (FE00) through FE17 (N=18). While this is the preferred method, the array may also be designed such that $N_1 * N_2$ is a fraction of N such that one or more of the smaller arrays is/are operated on in accordance with the present invention and the results from each of the smaller arrays are later combined.

To permute array 350 according to the present invention, each row j of array 350 is individually operated on, to permute the columns k of each row according to the equation:

$$D_1(j,k) = D(j, (\alpha k + \beta) \bmod P)$$

where:

j and k are row and column indices, respectively, in array 350;

P is a number greater than or equal to $N_2$;

$\alpha_j$ and P are relative prime numbers (one or both can be non-prime numbers, but the only divisor that they have in common is 1);

$\beta_j$ is a constant, one value associated with each row.

Once the data for all of the rows are permuted, the new array is read out column by column. Also, once the rows have been permuted, it is possible (but not required) to permute the data grouped by column before outputting the data. In the event that both the rows and columns are permuted, the rows, the columns or both may be permuted in accordance with the present invention. It is also possible to transpose rows of array, for example by transposing bits in the binary representation of the row index j. (In a four-row array, for example, the second and third rows would be transposed under this scheme.) It is also possible that either the rows or the columns, but not both may be permuted in accordance with a different method of permuting. Those skilled in the art will recognize that the system could be rearranged to store the data column by column, permute each set of data in a column and read out the results row by row without departing from the scope of the invention.

These methods of interleaving are based on number theory and may be implemented in software and/or hardware (i.e. application specific integrated circuits (ASIC), programmable logic arrays (PLA), or any other suitable logic devices). Further, a single pseudo random sequence generator (i.e. m-sequence, M-sequence, Gold sequence, Kasami sequence . . . ) can be employed as the interleaver.

In the example depicted in FIG. 3, the value selected for P is 6, the values of $\alpha$ are 5 for all three rows, and the values of $\beta$ are 1, 2, and 3 respectively for the three rows. (These are merely exemplary. Other numbers may be chosen to achieve different permutation results.) The values of $\alpha$ (5) are each relative prime numbers relative to the value of P (6), as stipulated above.

Calculating the specified equation with the specified values for permuting row 0 of array D 350 into row 0 of array $D_1$ 360 proceeds as:

$D_1(0,0) = D(0, (5*0+1) \bmod 6) = D(0, (1) \bmod 6) = D(0,1) = FE01$
$D_1(0,1) = D(0, (5*1+1) \bmod 6) = D(0, (6) \bmod 6) = D(0,0) = FE00$
$D_1(0,2) = D(0, (5*2+1) \bmod 6) = D(0, (11) \bmod 6) = D(0,5) = FE05$
$D_1(0,3) = D(0, (5*3+1) \bmod 6) = D(0, (16) \bmod 6) = D(0,4) = FE04$
$D_1(0,4) = D(0, (5*4+1) \bmod 6) = D(0, (21) \bmod 6) = D(0,3) = FE03$
$D_1(0,5) = D(0, (5*5+1) \bmod 6) = D(0, (26) \bmod 6) = D(0,2) = FE02$ Thus row 0 becomes: *FE01 FE00 FE05 FE04 FE03 FE02*

For row 1 the equations become:

$D_1(1,0) = D(1, (5*0+2) \bmod 6) = D(1, (2) \bmod 6) = D(1,2) = FE08$
$D_1(1,1) = D(1, (5*1+2) \bmod 6) = D(1, (7) \bmod 6) = D(1,1) = FE07$
$D_1(1,2) = D(1, (5*2+2) \bmod 6) = D(1, (12) \bmod 6) = D(1,0) = FE06$
$D_1(1,3) = D(1, (5*3+2) \bmod 6) = D(1, (17) \bmod 6) = D(1,5) = FE11$
$D_1(1,4) = D(1, (5*4+2) \bmod 6) = D(1, (22) \bmod 6) = D(1,4) = FE10$
$D_1(1,5) = D(1, (5*5+2) \bmod 6) = D(1, (27) \bmod 6) = D(0,3) = FE09$ Thus row 1 becomes: *FE08 FE07 FE06 FE11 FE10 FE09*

For row 2 the equations become:

$D_1(2,0) = D(2, (5*0+3) \bmod 6) = D(2, (3) \bmod 6) = D(2,3) = FE15$
$D_1(2,1) = D(2, (5*1+3) \bmod 6) = D(2, (8) \bmod 6) = D(2,2) = FE14$
$D_1(2,2) = D(2, (5*2+3) \bmod 6) = D(2, (13) \bmod 6) = D(2,1) = FE13$
$D_1(2,3) = D(2, (5*3+3) \bmod 6) = D(2, (18) \bmod 6) = D(2,0) = FE12$
$D_1(2,4) = D(2, (5*4+3) \bmod 6) = D(2, (23) \bmod 6) = D(2,5) = FE17$
$D_1(2,5) = D(2, (5*5+3) \bmod 6) = D(2, (28) \bmod 6) = D(0,4) = FE16$ Thus row 2 becomes: *FE15 FE14 FE13 FE12 FE17 FE16* and the permuted data frame is contained in array $D_1$ 360 shown in FIG. 3. Outputting the array column by column outputs the frame elements in the order:

1,8,15,0,7,14,5,6,13,4,11,12,3,10,17,2,9,16.

In an alternative practice of the invention, data frame 110 is stored in consecutive storage locations, not as an array or matrix, and a separate index array is stored to index the elements of the data frame, the index array is permuted according to the equations of the present invention, and the data frame is output as indexed by the permuted index array.

Figure 4:
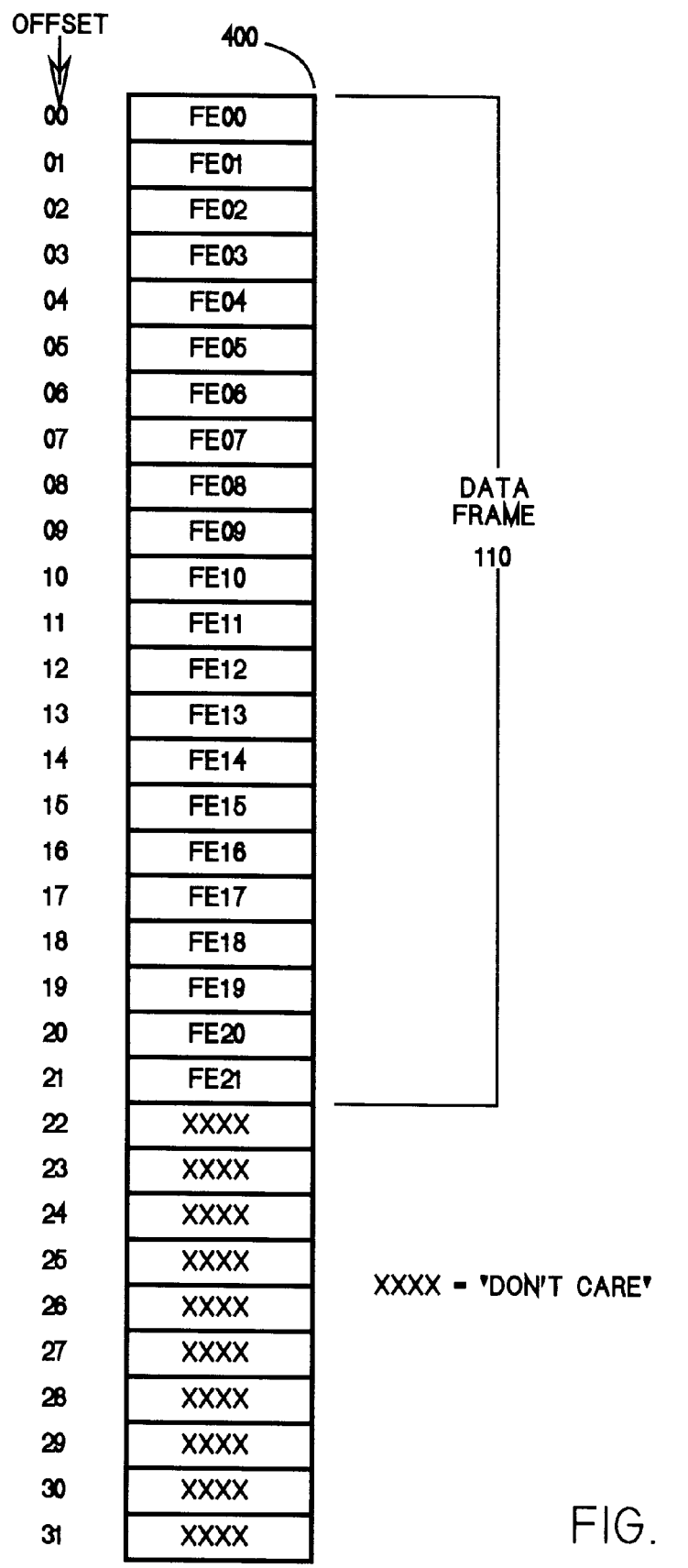
FIG. 4 depicts a data frame stored in consecutive storage locations.

FIG. 4 depicts a block 400 of storage 32 elements in length (thus having offsets of 0 through 31 from a starting storage location). A data frame 110, taken in this example to be 22 elements long and thus to consist of elements FE00 through FE21, occupies offset locations 00 through 21 within block 400. Offset locations 22 through 31 of block 400 contain unknown contents. A frame length of 22 elements is merely exemplary, and other lengths could be chosen. Also, storage of the frame elements in consecutive locations is exemplary, and non-consecutive locations could be employed.

FIG. 5 depicts index array I 550 for indexing storage block 400. It is organized as 4 rows of 8 columns each ($N_1=4$, $N_2=8$, $N=N_1*N_2=32$). Initial contents are filled in to array I 550 as shown in FIG. 5 sequentially. This sequential initialization yields the same effect as a row-by-row read-in of data frame 110.

The index array is permuted according to $$I_1(j,k)=I(j,(\alpha_j*k+\beta_j)\bmod P)$$

where
  $\alpha$=1, 3, 5, 7
  $\beta$=0, 0, 0, 0
  P=8

These numbers are exemplary and other numbers could be chosen, as long as the stipulations are observed that P is at least equal to $N_2$ and that each value of $\alpha$ is a relative prime number relative to the chosen value of P.

If the equation is applied to the columns of row 2, for example, it yields:

$$I_1(2, 0) = I(2, (5*0)mod8) = I(2, (0)mod8) = I(2, 0) = 16$$

$$I_1(2, 1) = I(2, (5*1)mod8) = I(2, (5)mod8) = I(2, 5) = 21$$

$$I_1(2, 2) = I(2, (5*2)mod8) = I(2, (10)mod8) = I(2, 2) = 18$$

$$I_1(2, 3) = I(2, (5*3)mod8) = I(2, (15)mod8) = I(2, 7) = 23$$

$$I_1(2, 4) = I(2, (5*4)mod8) = I(2, (20)mod8) = I(2, 4) = 20$$

$$I_1(2, 5) = I(2, (5*5)mod8) = I(2, (25)mod8) = I(2, 1) = 17$$

$$I_1(2, 6) = I(2, (5*6)mod8) = I(2, (30)mod8) = I(2, 6) = 22$$

$$I_1(2, 7) = I(2, (5*7)mod8) = I(2, (35)mod8) = I(2, 3) = 19$$

Applying the equation comparably to rows 0, 1, and 3 produces the permuted index array $I_1$ 560 shown in FIG. 5.

The data frame 110 is read out of storage block 400 and output in the order specified in the permuted index array $I_1$ 560 taken column by column. This would output storage locations in offset order:

0,8,16,24,1,11,21,31,2,14,18,30,3,9,23,29,4,12,20,28,5, 15,17,27,6,10,22,26,7,13,19,25.

However, the example assumed a frame length of 22 elements, with offset locations 22–31 in block 400 not being part of the data frame. Accordingly, when outputting the data frame it would be punctured or pruned to a length of 22; i.e., offset locations greater than 21 are ignored. The data frame is thus output with an element order of 0,8,16,1,11,21,2,14, 18,3,9,4,12,20,5,15,17,6,10,7,13,19.

In one aspect of the invention, rows of the array may be transposed prior to outputting, for example by reversing the bits in the binary representations of row index j.

Figure 2:
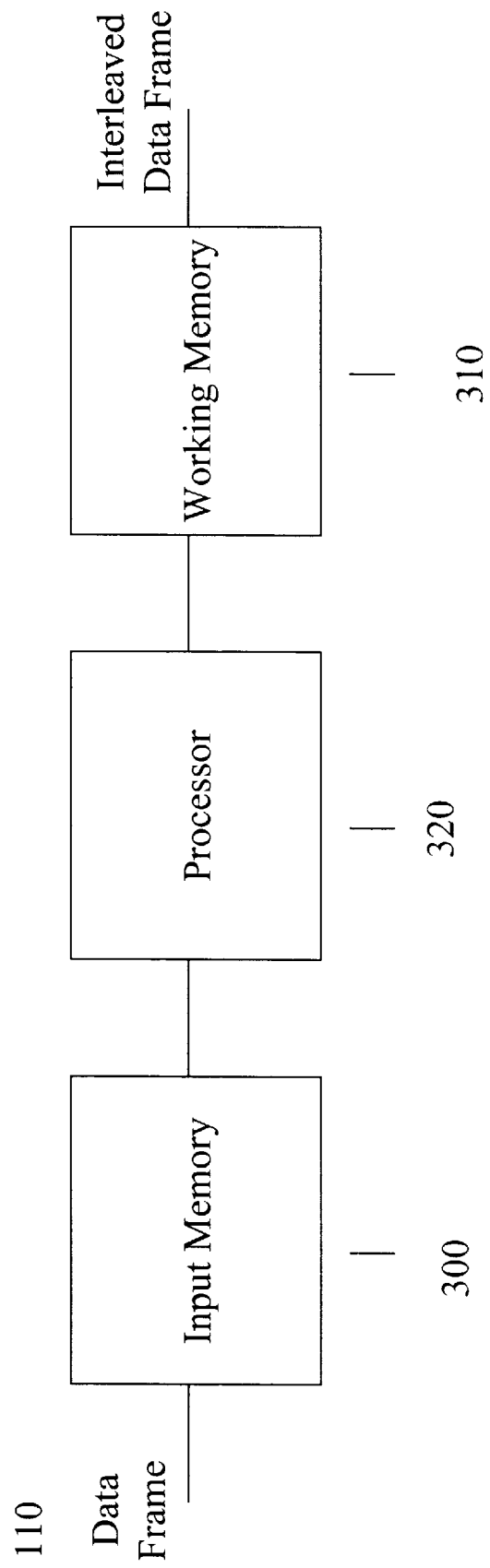
FIG. 2 depicts a block diagram of the interleaver illustrated in FIG. 1.

There are a number of different ways to implement the interleavers 100 of the present invention. FIG. 2 illustrates an embodiment of the invention wherein the interleaver 100 includes an input memory 300 for receiving and storing the data frame 110. This memory 300 may include shift registers, RAM or the like. The interleaver 100 may also include a working memory 310 which may also include RAM, shift registers or the like. The interleaver includes a processor 320 (e.g., a microprocessor, ASIC, etc.) which may be configured to process I(j,k) in real time according to the above-identified equation or to access a table which includes the results of I(j,k) already stored therein. Those skilled in the art will recognize that memory 300 and memory 310 may be the same memory or they may be separate memories.

For real-time determinations of I(j,k), the first row of the index array is permuted and the bytes corresponding to the permuted index are stored in the working memory. Then the next row is permuted and stored, etc. until all rows have been permuted and stored. The permutation of rows may be done sequentially or in parallel.

Whether the permuted I(j,k) is determined in real time or by lookup, the data may be stored in the working memory in a number of different ways. It can be stored by selecting the data from the input memory in the same order as the I(j,k)s in the permuted index array (i.e., indexing the input memory with the permuting function) and placing them in the working memory in sequential available memory locations. It may also be stored by selecting the bytes in the sequence they were stored in the input memory (i.e., FIFO) and storing them in the working memory directly into the location determined by the permuted I(j,k)s (i.e., indexing the working memory with the permuting function). Once this is done, the data may be read out of the working memory column by column based upon the permuted index array. As stated above, the data could be subjected to another round of permuting after it is stored in the working memory based upon columns rather than on rows to achieve different results.

If the system is sufficiently fast, one of the memories could be eliminated and as a data element is received it could be placed into the working memory, in real time or by table lookup, in the order corresponding to the permuted index array.

The disclosed interleavers are compatible with existing turbo code structures. These interleavers offer superior performance without increasing system complexity.

In addition, those skilled in the art will realize that de-interleavers can be used to decode the interleaved data frames. The construction of de-interleavers used in decoding turbo codes is well known in the art. As such they are not further discussed herein. However, a de-interleaver corresponding to the embodiments can be constructed using the permuted sequences discussed above.

Although the embodiment described above is a turbo encoder such as is found in a CDMA system, those skilled in the art realize that the practice of the invention is not limited thereto and that the invention may be practiced for any type of interleaving and de-interleaving in any communication system.

It will thus be seen that the invention efficiently attains the objects set forth above, among those made apparent from the preceding description. In particular, the invention provides improved apparatus and methods of interleaving codes of finite length while minimizing the complexity of the implementation.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A method of interleaving elements of frames of signal data communication channel, the method comprising;
   storing a frame of signal data comprising a plurality of elements as an array D having
   $N_1$ rows enumerated as 0, 1, . . . $N_1$−1; and
   $N_2$ columns enumerated as 0, 1, . . . $N_2$−1,
   wherein $N_1$ and $N_2$ are positive integers greater than 1; and
   permuting array D into array $D_1$ according to $$D_1(j,k)=D(j,(\alpha_j k+\beta_j) mod P)$$

wherein
   j is an index through the rows of arrays D and $D_1$;
   k is an index through the columns of arrays D and $D_1$;
   $\alpha_j$ and $\beta_j$ are integers predetermined for each row j;
   P is an integer at least equal to $N_2$; and
   each $\alpha_j$ is a relative prime number relative to P.

2. The method according to claim 1 wherein said elements of array D are stored in accordance with a first order and wherein said elements of array $D_1$ are output in accordance with a second order.

3. The method according to claim 2 wherein elements of array D are stored row by row and elements of array $D_1$ are output column by column.

4. The method according to claim 1 further including outputting of array $D_1$ and wherein the product of $N_1$ and $N_2$ is greater than the number of elements in the frame and the frame is punctured during outputting to the number of elements in the frame.

5. A method of interleaving elements of frames of signal data communication channel, the method comprising;
   creating and storing an index array I having
   $N_1$ rows enumerated as 0, 1, . . . $N_1$−1; and
   $N_2$ columns enumerated as 0, 1, . . . $N_2$−1,
   wherein $N_1$ and $N_2$ are positive integers greater than 1,
   storing elements of a frame of signal data in each of a plurality of storage locations;
   storing in row-by-row sequential positions in array I values indicative of corresponding locations of frame elements; and
   permuting array I into array $I_1$ according to $$I_1(j,k)=I(j,(\alpha_j k+\beta_j) mod P)$$

wherein
   j is an index through the rows of arrays I and $I_1$;
   k is an index through the columns of arrays I and $I_1$;
   $\alpha_j$ and $\beta_j$ are integers predetermined for each row j;
   P is an integer at least equal to $N_2$; and
   each $\alpha_j$ is a relative prime number relative to P, whereby the frame of signal data as indexed by array $I_1$ is effectively permuted.

6. The method according to claim 5 further including permuting said stored elements according to said permuted index array $I_1$.

7. The method according to claim 5 wherein said elements of the frame of data are output as indexed by entries of array $I_1$ taken other than row by row.

8. The method according to claim 7 wherein elements of the frame of data are output as indexed by entries of array $I_1$ taken column by column.

9. The method according to claim 5 including the step of transposing rows of array I prior to the step of permuting array I.

10. The method according to claim 5 wherein $N_1$ is equal to 4, $N_2$ is equal to 8, P is equal to 8, and the values of $\alpha_j$ are different for each row and are chosen from a group consisting of 1, 3, 5, and 7.

11. The method according to claim 10 wherein the values of $\alpha_j$ are 1, 3, 5, and 7 for j=0, 1, 2, and 3 respectively.

12. The method according to claim 11 wherein all values of $\beta$ are zero.

13. The method according to claim 10 wherein the values of $\alpha_j$ are 1, 5, 3, and 7 for j=0, 1, 2, and 3 respectively.

14. The method according to claim 13 wherein all values of $\beta$ are zero.

15. The method according to claim 5 wherein all values of $\beta$ are zero.

16. The method according to claim 5 wherein at least two values of $\beta$ are the same.

17. The method according to claim 5 further including outputting of the frame of data and wherein the product of $N_1$ and $N_2$ is greater than the number of elements in the frame of data and the frame of data is punctured during outputting to the number of elements in the frame of data.

18. An interleaver for interleaving elements of frames of data, the interleaver comprising;
    storage means for storing a frame of data comprising a plurality of elements as an array D having
    $N_1$ rows enumerated as 0, 1, . . . $N_2$−1; and
    $N_2$ columns enumerated as 0, 1, . . . $N_2$−1,
    wherein $N_1$ and $N_2$ are positive integers greater than 1, and permuting means for permuting array D into array $D_1$ according to $$D_1(j,k)=D(j,(\alpha_j k+\beta_j) mod P)$$

wherein
    j is an index through the rows of arrays D and $D_1$;
    k is an index through the columns of arrays D and $D_1$;
    $\alpha_j$ and $\beta_j$ are integers predetermined for each row j;
    P is an integer at least equal to $N_2$; and
    each $\alpha_j$ is a relative prime number relative to P.

19. The interleaver according to claim 18 including means for storing said elements of array D in accordance with a first order and means for outputting said elements of array $D_1$ in accordance with a second order.

20. The interleaver according to claim 19 wherein said means for storing said elements of array D stores row by row and said means for outputting elements of array $D_1$ outputs column by column.

21. The interleaver according to claim 18 including means for outputting said array $D_1$ and for puncturing said array $D_1$ to the number of elements in the frame when the product of $N_1$ and $N_2$ is greater than the number of elements in the frame.

22. An interleaver for interleaving elements of frames of data, the interleaver comprising;
    means for storing an index array I having
    $N_1$ rows enumerated as 0, 1, . . . $N_1$−1; and
    $N_2$ columns enumerated as 0, 1, . . . $N_2$−1, wherein $N_1$ and $N_2$ are positive integers greater than 1, and means for receiving a frame of data and storing elements of the frame of data in each of a plurality of storage locations;

means for storing in row-by-row sequential positions in array I values indicative of corresponding locations of frame elements; and means for permuting array I into array $I_1$ according to:

$$I_1(j,k)=I(j,(\alpha_j k+\beta_j) mod P)$$

wherein j is an index through the rows of arrays I and $I_1$;

k is an index through the columns of arrays I and $I_1$;

$\alpha_j$ and $\beta_j$ are integers predetermined for each row j;

P is an integer at least equal to $N_2$; and each $\alpha_j$ is a relative prime number relative to P, whereby the frame of data as indexed by array $I_1$ is effectively permuted.

23. The interleaver according to claim 22 further including means for permuting said stored elements according to said permuted index array $I_1$.

24. The interleaver according to claim 22 including means for outputting frame elements as indexed by entries of array $I_1$ taken other than row by row.

25. The interleaver according to claim 24 including means for outputting frame elements as indexed by entries of array $I_1$ taken column by column.

26. The interleaver according to claim 22 wherein the product of $N_1$ and $N_2$ is greater than the number of elements in the frame and the frame is punctured by the means for outputting to the number of elements in the frame.

27. An interleaver for interleaving elements of frames of data, the interleaver comprising;

an input memory for storing a received frame of data comprising a plurality of elements as an array D having
$N_1$ rows enumerated as 0, 1, . . . $N_1$-1; and
$N_2$ columns enumerated as 0, 1, . . . $N_2$-1,
wherein $N_1$ and $N_2$ are positive integers greater than 1;

a processor coupled to said input memory for permuting array D into array $D_1$ according to $$D_1(j,k)=D(j,(\alpha_j k+\beta_j) mod P)$$

wherein j is an index through the rows of arrays D and $D_1$;

k is an index through the columns of arrays D and $D_1$;

$\alpha_j$ and $\beta_j$ are integers predetermined for each row j;

P is an integer at least equal to $N_2$; and each $\alpha_j$ is a relative prime number relative to P, and a working memory coupled to said processor and configured to store the permuted array $D_1$.

28. The interleaver according to claim 27 wherein said input memory stores said elements of array D in accordance with a first order and said working memory outputs said elements of array $D_1$ in accordance with a second order.

29. The interleaver according to claim 28 wherein said input memory stores elements of array D row by row and said working memory outputs elements of array $D_1$ column by column.

30. The interleaver according to claim 27 said working memory punctures said array $D_1$ to the number of elements in the frame when the product of $N_1$ and $N_2$ is greater than the number of elements in the frame.

31. An interleaver for interleaving elements of frames of data, the interleaver comprising;

a memory for storing an index array I having
$N_1$ rows enumerated as 0, 1, . . . $N_1$-1; and
$N_2$ columns enumerated as 0, 1, . . . $N_2$-1,
wherein $N_1$ and $N_2$ are positive integers greater than 1, and said memory also for storing elements of a received frame of data in each of a plurality of storage locations;

a processor coupled to said memory for storing in row-by-row sequential positions in array I values indicative of corresponding locations of frame elements; and said processor also for permuting array I into array $I_1$ stored in said memory according to:

$$I_1(j,k)=I(j,(\alpha_j k+\beta_j) mod P)$$

wherein j is an index through the rows of arrays I and $I_1$;

k is an index through the columns of arrays I and $I_1$;

$\alpha_j$ and $\beta_j$ are integers predetermined for each row j;

P is an integer at least equal to $N_2$; and each $\alpha_j$ is a relative prime number relative to P, and whereby the frame of data as indexed by array $I_1$ is effectively permuted.

32. The interleaver according to claim 31 wherein said processor permutes said stored elements according to said permuted index array $I_1$.

33. The interleaver according to claim 31 wherein said memory outputs frame elements as indexed by entries of array $I_1$ taken other than row by row.

34. The interleaver according to claim 33 wherein said memory outputs frame elements as indexed by entries of array $I_1$ taken column by column.

35. The interleaver according to claim 31 wherein said memory punctures the frame of data to the number of elements in the frame of data when the product of $N_1$ and $N_2$ is greater than the number of elements in the frame of data.

* * * * *